United States Patent [19]

Iwamuro

[11] Patent Number: 5,644,150
[45] Date of Patent: Jul. 1, 1997

[54] INSULATED GATE THYRISTOR

[75] Inventor: Noriyuki Iwamuro, Nagano, Japan

[73] Assignee: Fuji Electric Co., Ltd., Japan

[21] Appl. No.: 406,184

[22] Filed: Mar. 16, 1995

[30] Foreign Application Priority Data

Mar. 28, 1994 [JP] Japan ................................ 6-056407

[51] Int. Cl.$^6$ .......................... H01L 29/74; H01L 31/111
[52] U.S. Cl. .......................... 257/147; 257/152; 257/153
[58] Field of Search ...................................... 257/147, 146, 257/132, 133, 154, 152, 162, 163, 153

[56] References Cited

U.S. PATENT DOCUMENTS 5,397,905   3/1995   Otsuki et al. ............................ 257/133

FOREIGN PATENT DOCUMENTS

| 1-265569 | 10/1989 | Japan ................................ 257/139 |
| 05-21783 | 1/1993 | Japan ................................ 257/147 |
| WO/91 003078 | 3/1991 | WIPO ................................ 257/147 |

OTHER PUBLICATIONS

"Dual Gate MOS Thyriston (DGMOT)"; Yasukazu Seki et al; 1993, IEEE, pp. 159–164.

IGBT Mode Turn–Off Thyristor (IGIT) Fabricated on SOI Subsrate by Tsuneo Ogura et al., 1993 IEEE, pp. 9.5.1–9.5.4.

Double Gate MOS Device Having IGBT and MCT Performances by Seiji Momota et al., 1992 International Symposium on Power Semiconductor Devices & ICs, Tokyo, pp. 28–33.

Dual Gate MOS Thyristor (DGMOT) by Yasukazu SEKI et al., 1993 IEEE, pp. 159–164.

Switching Behavior and Current Handling Performance of MCT–IGBT Cell Ensembles by H. Lendenmann et al., 1991 IEEE, pp. 6.3.1–6.3.4.

*Primary Examiner*—Wael Fahmy
*Attorney, Agent, or Firm*—Rossi & Associates

[57] ABSTRACT

A double gate type insulated gate thyristor is provided which improves the breakdown withstand capability by turning on at low on-voltage by a thyristor operation mode and by turning off at high speed by an IGBT operation mode. In the insulated gate thyristor, a part of an n$^+$ source region is removed and a p-base region is directly connected with a part of a cathode so as to connect a bipolar transistor with a main thyristor in parallel. A part of a switching-off current flows through the bipolar transistor to the cathode and the switching-off current which flows through a lateral MOSFET to the second gate electrode is reduced. By this configuration, the breakdown withstand capability is improved.

6 Claims, 4 Drawing Sheets

INSULATED GATE THYRISTOR

FIELD OF THE INVENTION

The present invention relates to an insulated gate thyristor used as a power switching device.

BACKGROUND OF THE INVENTION

Thyristors have been used as indispensable devices for large capacity power conversion due to their low on-voltage characteristics. Specifically, GTO (gate turn-off) thyristors are currently used very often in the high-voltage, large-current range applications. Drawbacks of the GTO thyristors, however, have also become clear. The drawbacks include the fact that the GTO thyristors require a large gate current for turning-off, that is a turn-off gain of the GTO thyristors is small, and the fact that the GTO thyristors require large snubber circuits for safe turn-off. In addition, the GTO thyristors are of limited use in a considerably low frequency range because of their slow switching speed.

In 1984, a MOS control thyristor (MCT) was proposed that may be classified into a voltage drive type device (See article by Temple, IEEE IEDM Tech. Dig., page 282). Since then, analysis and improvement of the MCT have been done world wide, since the MCT, which is a voltage driven type device, can be driven with a much simpler gate circuit than the GTO thyristors, and since the MCT turns on at a low on-voltage.

In addition, a novel device structure has been recently proposed that has double gate structures for turning on the device in a thyristor mode and for turning off the device in an IGBT mode (See article by S. Momota et al., Proceedings of IEEE ISPSD '92 (1992), P28, and article by Seki et al., Proceedings of IEEE ISPSD '93 (1993), P159).

FIG. 3 is a sectional view showing a DGMOS, the device proposed in 1992. In this device, an n− layer 23 is formed on a $p^+$ collector layer 21 through an $n^+$ buffer layer 22. A p-base region 24 is selectively formed in a surface layer of the n− layer 23, and n-base region 25 is selectively formed in a surface layer of the p-base region 24. A p-emitter region 26 is selectively formed in a surface layer of the n-base region 25. An emitter electrode 27, connected to an emitter terminal E, contacts commonly with the surfaces of the p-emitter region 26 and the n-base region 25. The first gate electrode 31 is disposed from above an area of the n-base region 25, sandwiched by the p-base region 24 and the p-emitter region 26, to above an exposed area of the n− layer 23 through a gate oxide film 28. The first gate electrode 31 is covered with an insulation film 29 and connected with the first gate terminal $G_1$. The second gate electrode 32 is disposed from above an exposed area of the p-base region 24 and to above an area of the n-base region 25 sandwiched by the p-base region 24 and the p-emitter region 26 through the gate oxide film 28. The second gate electrode 32 is covered with an insulation film 29 and connected with the second gate terminal $G_2$. The $p^+$ collector layer 21 is connected with a collector electrode 30 which is further connected with a collector terminal C.

A voltage, the wave form of which is shown in FIG. 4, is applied to the first and the second gate electrodes 31 and 32. When voltage higher than a threshold value is applied to the terminal $G_1$, an inversion layer is formed in a surface of the p-base region 24 under the gate electrode 31. An electron current, based on electrons which pass through the inversion layer, flows in the n− layer 23 and the $n^+$buffer layer 22. Since positive voltage is applied to the collector electrode 31, the electron current which flows in the built-in n− layer 23 and the $n^+$ buffer layer 22 functions as a base current of a PNP transistor consisted of the $p^+$ layer 21, the $n^+$ buffer layer 22, the n− layer 23 and the p-base region 24. The electron current which has flown in the built-in PNP transistor modulates the conductivity of the n− layer 23 and turns on the PNP transistor. A hole current generated by the conductivity modulation functions as a base current of an NPN transistor and drives the NPN transistor which is consisted of the built-in n− layer 23, the $n^+$ buffer layer 22, the p-base region 24 and the n-base region 25. Finally, a PNPN transistor, consisted of the $p^+$ layer 21, the $n^+$ buffer layer 22, the n− layer 23, the p-base region 24 and the n-base region 25, is driven to turned on the device from the terminal $G_1$.

The device is turned off by switching off the voltage applied to the gate electrodes 31, 32 with a time gap between the electrodes 31 and 32 as shown in FIG. 4. Since the voltage of the gate electrode 32 grounded at time $t_1$ becomes negative with respect to the voltage of the gate electrode 31, an inversion layer is formed in the surface under the gate electrode 32 of the n-base region 25 to turn on a p-channel MOSFET. When the p-channel MOSFET turns on through the terminal $G_1$, the p-base region 24 and the n-base region 25 are short-circuited. Thus, the device structure becomes essentially equivalent to that of the IGBT.

Therefore, in a steady state operation, the device is operated at first as a thyristor through the gate electrode 31. The device is switched, at first when the device is turned off, from the thyristor mode to an on-state of an IGBT by applying a negative bias at time $t_1$ to the gate electrode 32 with respect to the gate electrode 31. After 2 to 4 μsec has elapsed since the device was switched to the IGBT operation mode, the device is turned off by stopping electron supply by switching off at time $t_2$ the voltage applied to the gate electrode 31.

The DGMOS proposed in 1993 is a device which lowers on-resistance by replacing the p-channel device of FIG. 3 by an n-channel device. These devices are characterized by their dual modes which realize the low on-voltage of the thyristor and high speed switching of the IGBT in a single device.

However, since a large tail current is caused at switching in the MCTs as in the GTO thyristors, the MCTs are used also in a low frequency range. Further, the devices with two insulation structure cannot be practically used, since the current which the devices can control is small.

In view of the foregoing, an object of the present invention is to provide an insulated gate thyristor which facilitates with a single device controlling a large current and switching at high speed.

SUMMARY OF THE INVENTION

The object of the present invention is achieved by an insulated pate thyristor which is comprised of: a base layer of a first conductivity type and of high resistivity; the first base region of a second conductivity type selectively formed in a surface layer on the first side of the base layer; the first source region of the first conductivity type, the second source region of the first conductivity type, and an emitter region of the first conductivity type, selectively formed in a surface layer of the first base region and aligned from an edge side of the first base region; an emitter layer of the second conductivity type formed on the second side of the base layer with a buffer layer of the first conductivity type and of low resistivity interposed therebetween; the first gate electrode disposed in an insulation film over a surface of the first base region sandwiched between the first source region and an exposed area of the base layer; the second gate electrode disposed on an insulation film over an exposed area of the first base region sandwiched between the second source region and the emitter region; the first main electrode contacting with the emitter layer; the second main electrode contacting in common with the emitter region, the first source region, and the first base region in a void of the first source region; and an auxiliary electrode contacting in common with the second source region and the first base region.

The insulated gate thyristor is preferably comprised of the second base region of the second conductivity type and of low resistivity selectively formed in a region of the first base region including a region underneath a part of the first source region and the second source region.

The insulated gate thyristor is preferably comprised further of a contact region of the second conductivity type and of further lower resistivity selectively formed in a region of a surface layer of the second base region adjacent to the second source region, the contact region contacting with the auxiliary electrodes.

It is preferable to form the first source region in a stripe leaving the void area in its longitudinal direction.

When voltage is applied to the first gate electrode, a channel is formed in the surface layer, underneath the first gate electrode, of the first base region, and the first carrier is fed from the second main electrode contacting the first source region. The first carrier functions as a base current of the base layer, which is sandwiched between the emitter layer and the first base region and constitutes with the buffer layer a bipolar transistor, and drives the bipolar transistor. In association with this, the second carrier is injected from the emitter layer. Since the injection of the second carrier encourages injection of the first carrier from the emitter region, a main thyristor, consisted of the emitter layer, the buffer layer, the base layer, the first base region and the emitter region, is driven, and the first and the second main electrodes conduct with each other at low on-voltage.

For turning off the insulated gate thyristor, voltage is applied at first to the second gate electrode to form a channel between the emitter region and the second source region. As soon as the channel is formed, the second carrier injected from the emitter layer flows from the first base region to the emitter region via the auxiliary electrode, the second source region, and the channel. By this mechanism, the insulated gate thyristor shifts to the IGBT operation mode, which turns off the insulated gate thyristor at high speed.

In the double gate type insulated gate thyristor of the prior art, since all the switching currents flow through a channel formed by the voltage applied to the second gate electrode, the controllable current and the breakdown withstand capability are limited by the channel resistance of low mobility. According to the present invention, the switching current which flows through the above described channel is decreased and the controllable current is increased by passing a part of the switching current by the MOSFET and by flowing the by-passed switching current through a bipolar transistor, consisted of the emitter layer, the buffer layer, the base layer and the first base region, to the second main electrode through the void of the first source region.

BRIEF DESCRIPTION OF THE DRAWING FIGURES

The invention will be described with reference to the accompanying figures, wherein.

Figure 8:
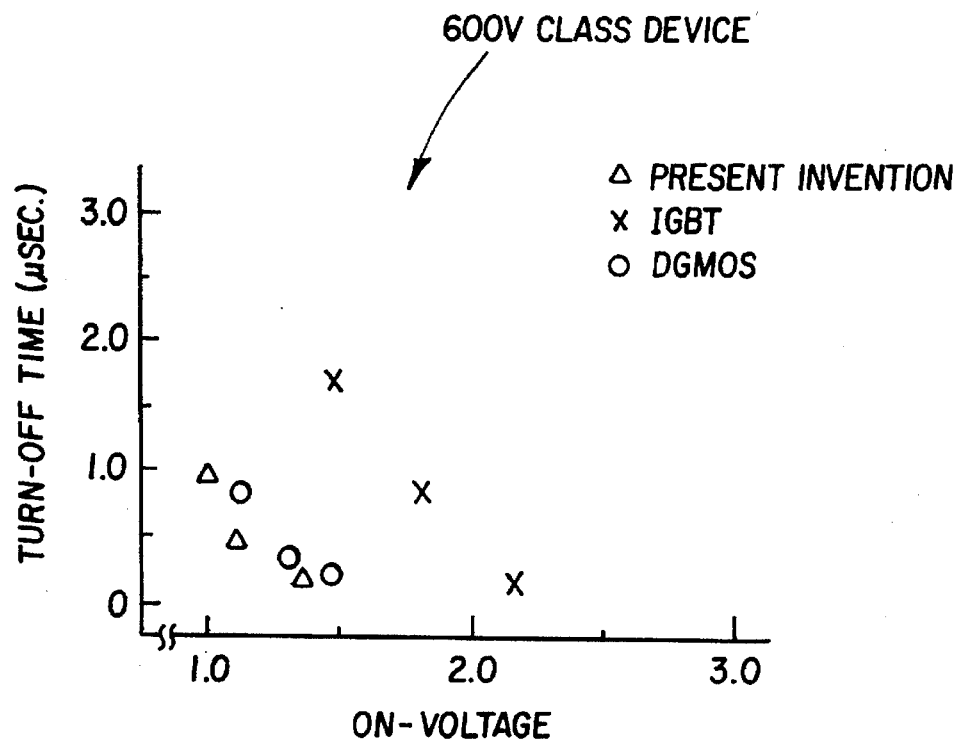
Figure 9:
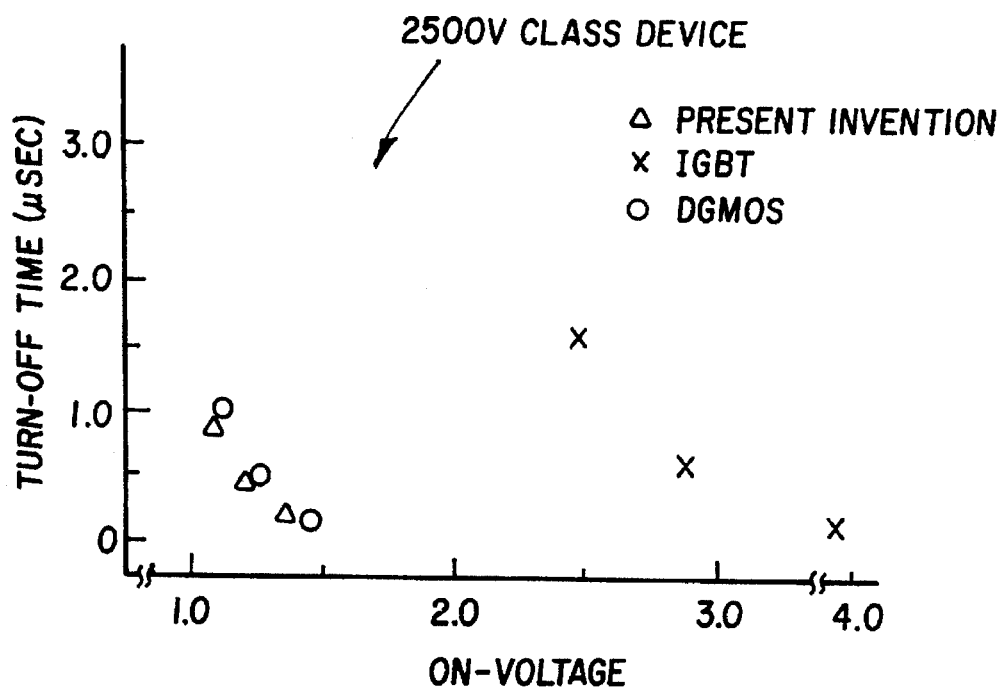

FIG. 8 is a graph which compares the trade-off characteristics between the on-voltage and the turn-off time of the 600V-class device of the present invention with those of the DGMOS and the IGBT of 600V-class; and FIG. 9 is a graph which compares the trade-off characteristics between the on-voltage and the turn-off time of the 2500V-class device of the present invention with those of the DGMOS and the IGBT of 2500V-class.

DETAILED DESCRIPTION OF THE PREFERRED EMBODIMENTS

Figure 1:
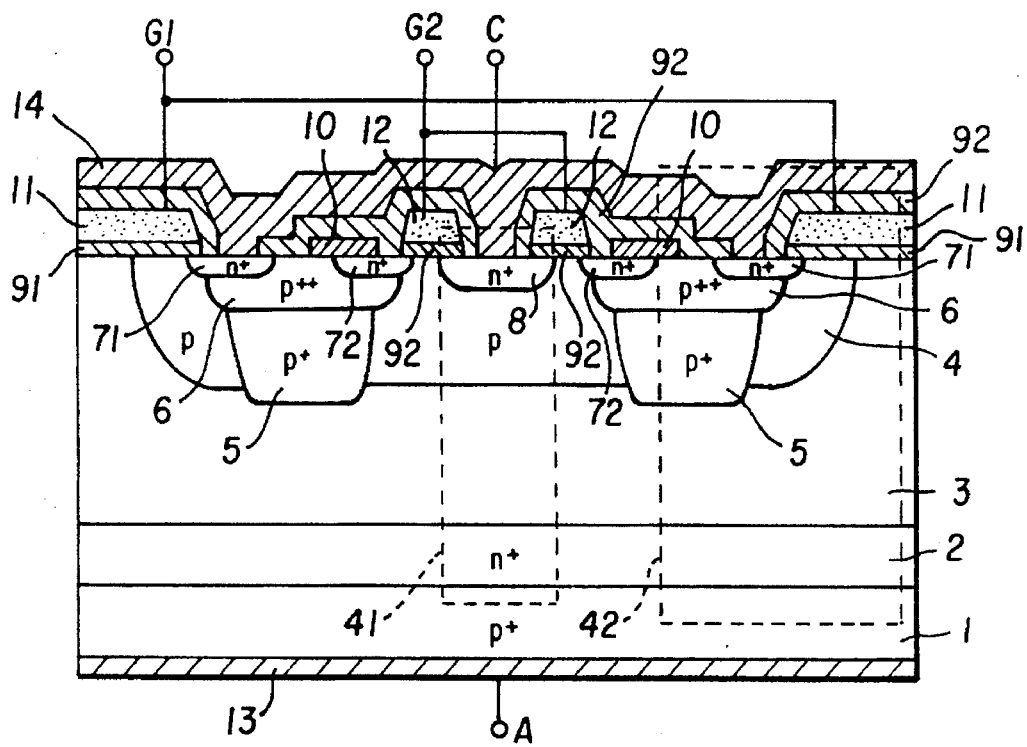
FIG. 1 is a sectional view showing an embodiment of an insulated gate thyristor according to the present invention.
Figure 2:
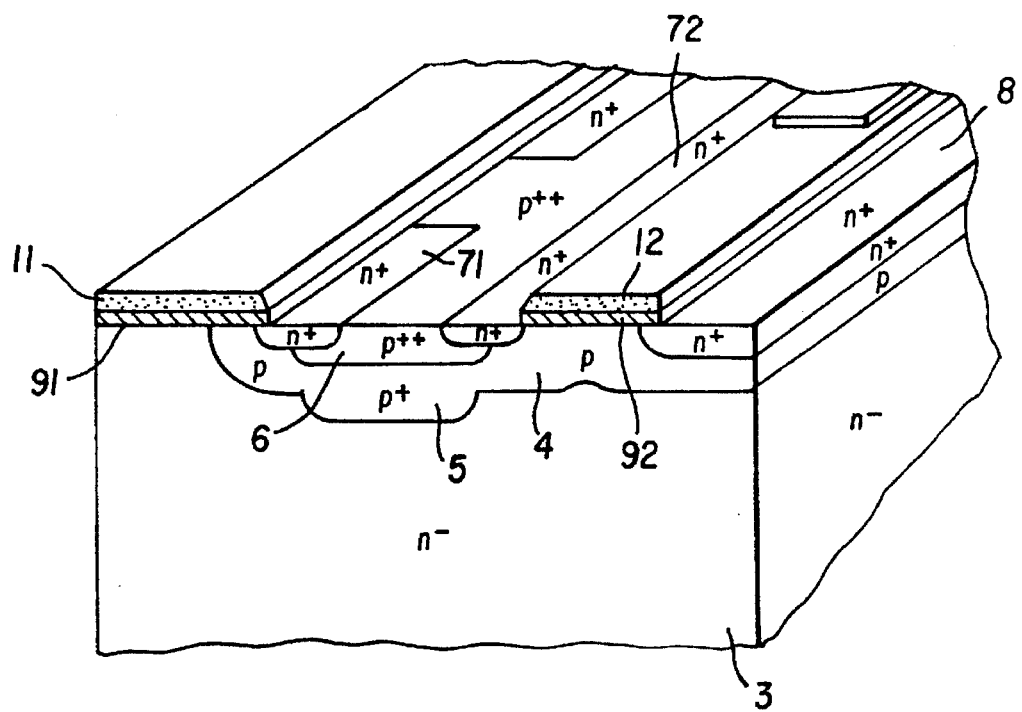
FIG. 2 is an isometric view showing the cell pattern of the insulated gate thyristor of FIG. 1.
Figure 3:
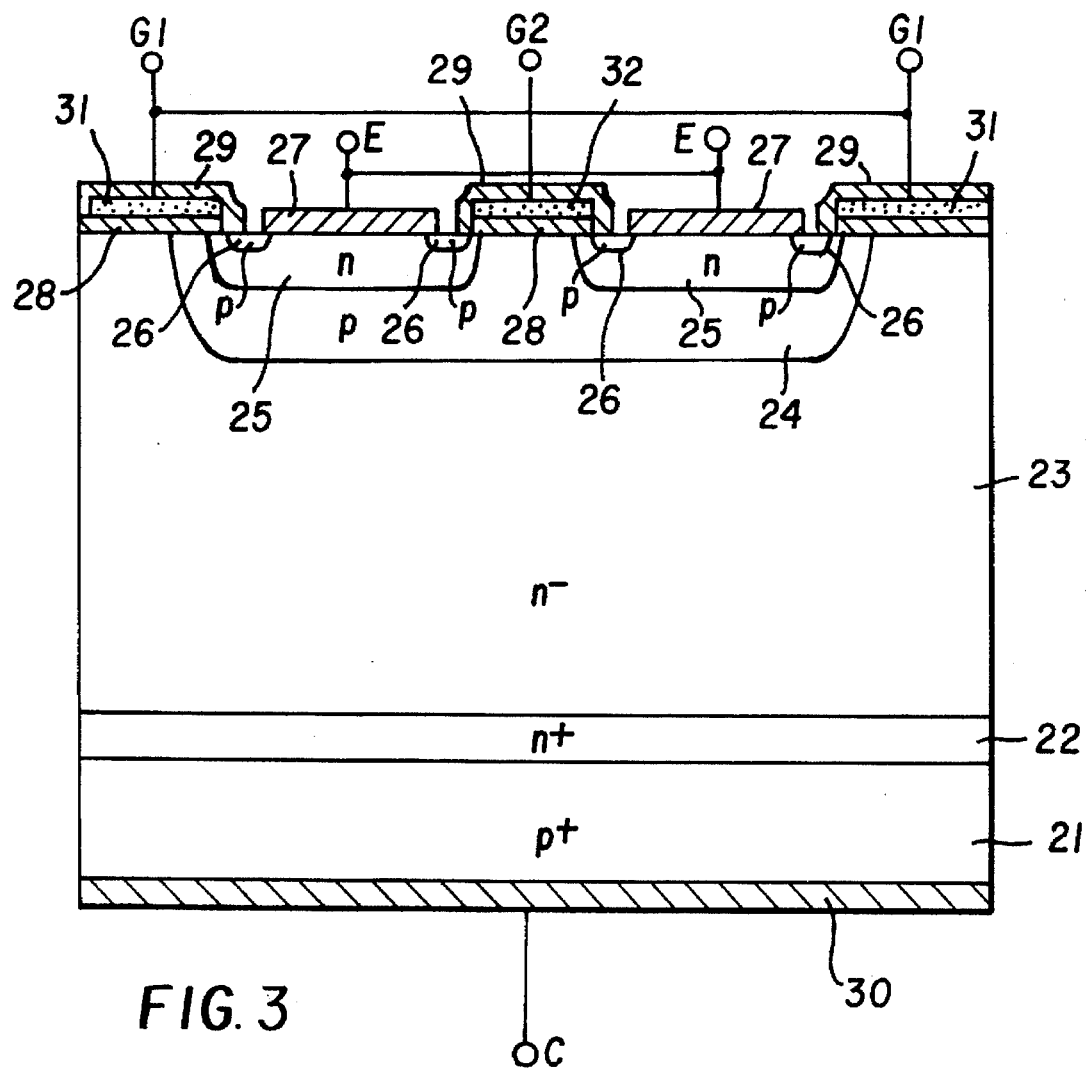
FIG. 3 is a sectional view showing a DGMOS according to the prior art.
Figure 4:
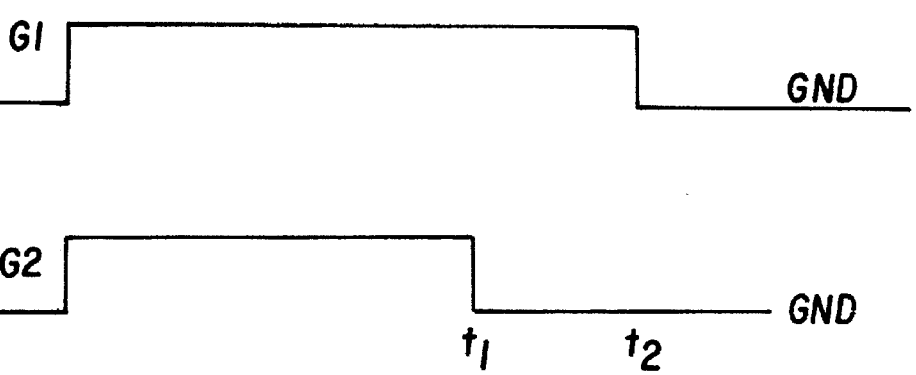
FIG. 4 is a diagram showing the gate voltage waveform for driving the device of FIG. 3.

FIG. 1 is a sectional view showing an embodiment of an insulated gate thyristor according to the present invention, and FIG. 2 is an isometric view showing the cell pattern of the insulated gate thyristor of FIG. 1. In this device, a p-base region 4 is selectively formed in the first surface of an $n^-$ base layer 3 of high resistivity, and a $p^+$ base region 5 is formed in a part of the $n^-$ base layer 3. On the second surface of the $n^-$ base layer 3, a $p^+$ emitter layer 1 is formed through an $n^+$ buffer layer 2. A $p^+$ contact region 6 is formed overlapping a part of the surface layer of the $p^+$ base region 5. The first $n^+$ source region 71 and the second $n^+$ source region 72 are formed from a surface layer of the p-base region 4 to a surface layer of the $p^+$ contact layer 6. An $n^+$ emitter region 8 is formed in the surface layer of the p-base region 4 between a pair of the second $n^+$ type source regions 72, 72. The first gate electrode 11 is disposed over an exposed area of the $n^-$ base layer 3 through a gate oxide film 91 and extended over the p-base region 4 to the first source region 71. The second gate electrode 12 is disposed through a gate oxide film 92 over an exposed area of the $n^-$ base layer 3 sandwiched between the second source region 72 and the emitter region 8.

An auxiliary electrode 10 contacts commonly with the second source region 72 and the $p^+$+ contact layer 6. An anode 13, as the first main electrode connected with an anode terminal A, contacts with the $p^+$ emitter layer 1. And, cathode 14, as the second main electrode connected with a cathode terminal C, contacts with the first source region 71 and the emitter region 8. The first and the second gate electrodes 11 and 12, and the gate electrodes and the second main electrode 14 are separated from each other respectively with insulator films 92 of phosphorus glass (PSG), silicon oxide, etc.

The behavior of this insulated gate thyristor is explained below. An inversion layer (partial storage layer) is formed beneath the gate oxide film 91 and a lateral MOSFET is turned on by grounding the cathode 14, and by applying positive voltage to the gate electrode 11 in the state that positive voltage is applied to the anode 12. By this operation, electrons are fed at first from the cathode 14 to the n⁻ base layer 3 via a channel of the MOSFET, and the first source region 71 to the MOSFET. The fed electrons function as a base current of a PNP transistor (consisted of the p⁺ emitter layer 1, the n⁺ buffer layer 2, the n⁻ base layer 3 and the p-base region 4 (the p⁺ base region 5)) and drive the PNP transistor. Holes are injected from the p⁺ emitter layer 1, and some of the injected holes flow to the p-base region 4 via the n⁺ buffer layer 2 and the n⁻ base layer 3. So, by encouraging electron injection from the n⁺ emitter region 8 by boosting the potential of the p-base region 4, a main thyristor 41 functions. At that time, the second gate electrode 12 is held at zero potential.

When the insulated gate thyristor is turned off, the lateral MOSFET is turned off at first by lowering the potential of the second gate electrode 12 below the threshold value of the MOSFET. By this operation, the p-base region 4 is biassed at the same potential with the cathode 14 through the MOSFET. As a result of this, the holes, injected from the p⁺ emitter layer 1, flow to the cathode 14 from the p-base region 4 via the p⁺+ contact region 6, the auxiliary electrode 10, and the second source region 72, an n-channel and the n⁺ emitter region 8, and shifts the insulated gate thyristor to an IGBT operation mode by the IGBT 42. At that time, the insulated gate thyristor is turned off through the same process with that of the IGBT by biassing the first gate electrode 11 lower than the threshold value. However, so as not to flow all the currents through the above described MOSFET in the IGBT mode, a transistor structure, in which the contact region 6 is directly contacted with the cathode 14, is left without forming a part of the first source region 71 as shown in FIG. 2.

Figure 5:
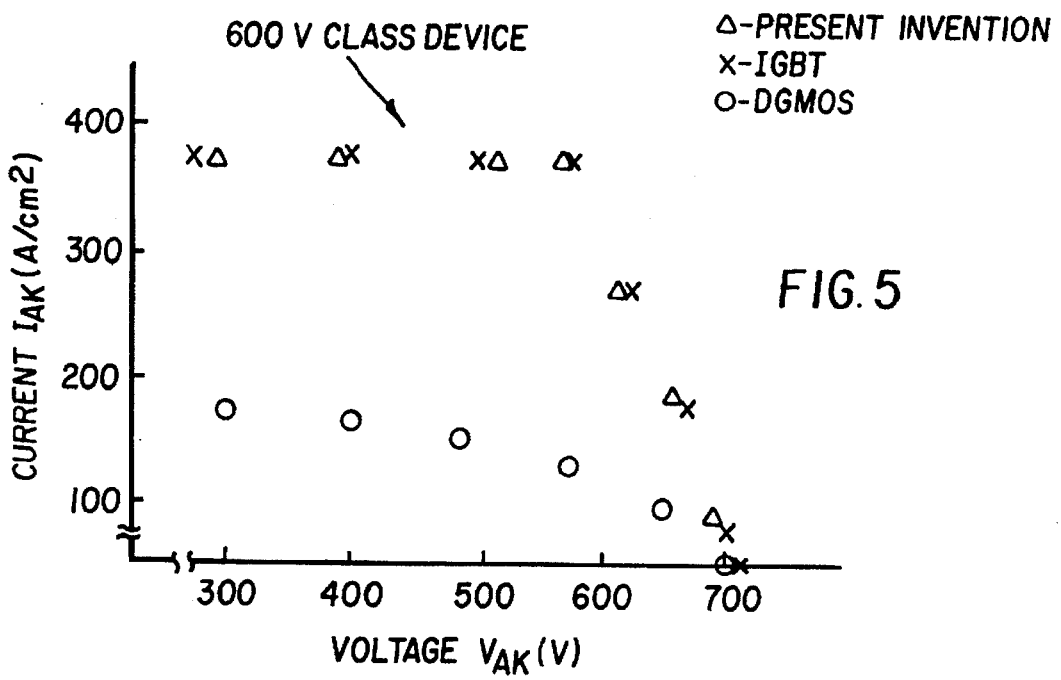
FIG. 5 is a voltage-current diagram comparing the reverse bias safe operation area (RBSOA) of the 600V-class device of the present invention with those of the devices of the prior art.
Figure 6:
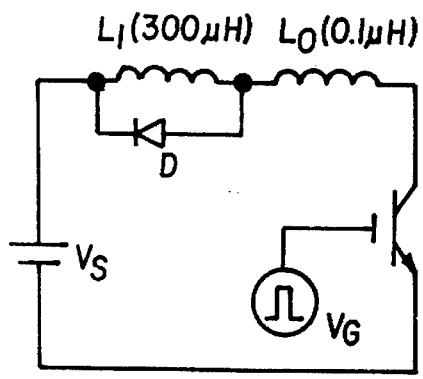
FIG. 6 is a diagram of a circuit for measuring RBSOA.

FIG. 5 is a voltage current diagram which compares the reverse bias safe operation area (RBSOA), measured at 125° C. with a circuit shown in FIG. 6, of the insulated gate thyristor of the present invention with that of the DGMOS and the IGBT described earlier. These three kinds of devices are designed at a withstand voltage of 600 V. A wafer is used for each device in which an n⁺ layer with resistivity of 0.1 Ωcm and thickness of 10 μm as the n⁺ buffer layer 2 or 22, and an n⁻ layer of 40 Ωcm and thickness of 5 μm as the n⁻ base layer 3 or 23 are grown epitaxially on a p⁺ silicon substrate with resistivity of 0.02 Ωcm and thickness of 450 μm as the p⁺ emitter layer 1 or the p⁺ collector layer 2. The chip size of each device is 1 cm². The on-voltage, defined by the potential drop when a current of 100 A flows, is 1.1 V in the device of this invention, 1.1 V in the DGMOS, and 2.3 V in the IGBT. As FIG. 5 indicates, the device of this invention shows lower on-voltage than that of the IGBT, and breakdown withstand capability equivalent to that of the DGMOS and twice as high as that of the IGBT.

Figure 7:
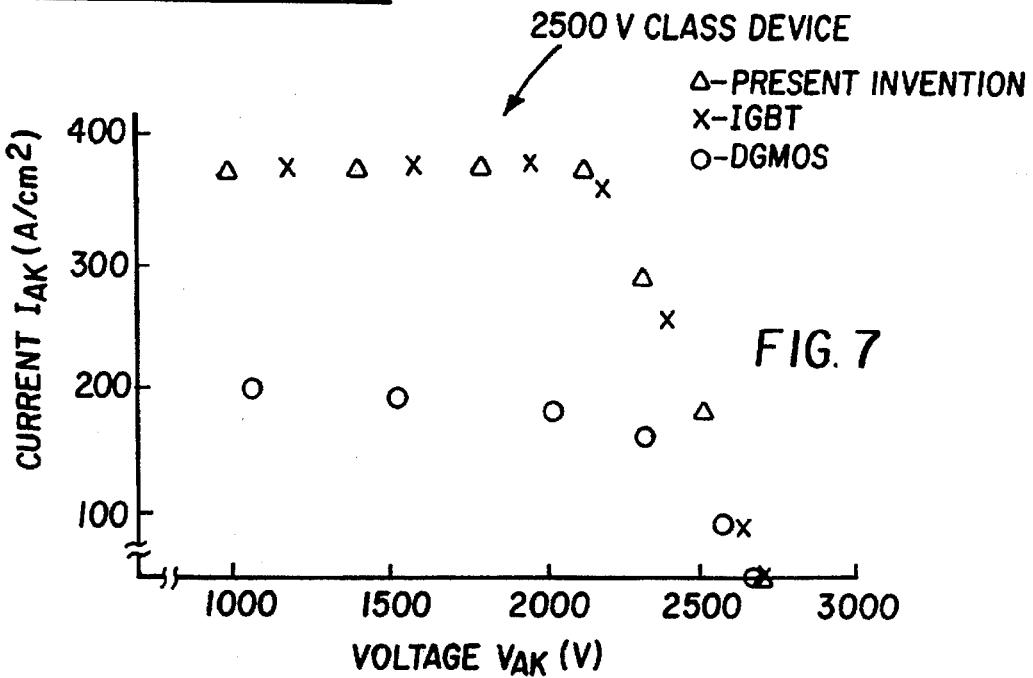
FIG. 7 is a voltage-current diagram comparing the reverse bias safe operation area (RBSOA) of the 2500V-class device of the present invention with those of the devices of the prior art.

FIG. 7 is a voltage-current diagram which compares the reverse bias safe operation area (RBSOA) of the insulated gate thyristor of the present invention with that of the DGMOS and the IGBT. These three kind of devices are designed at withstand voltage of 2500 V and manufactured from a bulk wafer. The on-voltage is 1.3 V in the device of this invention, 1.3 V in the DGMOS, and 3.8 V in the IGBT. The 2500V-class device of the present invention shows, similarly as the 600V-class device manufactured from an epitaxial wafer, much wider safe operation area than those of the DGMOS and the IGBT. In other words, the present invention facilitates widening the safe operation area not on the basis of the crystal growth, resistivity of the n⁻ base layer, and current amplification factor of the PNP wide base transistor without causing on-voltage increase.

FIG. 8 is a graph which compares the trade-off characteristics between the on-voltage and the turn-off time of the 600V-class device with those of the 600V-class DGMOS and the 600V-class IGBT. FIG. 9 is a graph which compares the trade-off characteristics between the on-voltage and turn-off time of the 2500V-class device with those of the 2500V-class DGMOS and the 2500V-class IGBT. These figures indicate that the insulated gate thyristor according to the present invention shows an excellent trade-off characteristics almost equivalent to that of the DGMOS and better than that of the IGBT.

According to the present invention, the withstand capability is improved by flowing a part of the switching current of an insulated gate thyristor, which switches with two gates from a thyristor operation mode to an IGBT operation mode at switching, directly to the main electrode by-passing the built-in MOSFET. By this measure, the voltage drive type thyristor of the present invention shows, in a wide withstand voltage range between 600 V and 2500 V or more, much better trade-off relation between the on-voltage and the turn-on time, and much better breakdown withstand capability than the devices according to the prior art.

The invention has been described with reference to certain preferred embodiments thereof. Modifications and variations are possible, however, within the scope of the appended claims.

What is claimed is:

1. An insulated gate thyristor comprising:

a base layer of a first conductivity type and of high resistivity;

a first base region of a second conductivity type selectively formed in a surface layer on a first side of said base layer;

a first source region of the first conductivity type;

a second source region of the first conductivity type;

an emitter region of the first conductivity type, said first source region, said second source region and said emitter region being selectively formed in a surface layer of said first base region and aligned from an edge side thereof;

an emitter layer of the second conductivity type formed on a second side of said base layer with a buffer layer of the first conductivity type and of low resistivity interposed therebetween;

a first gate electrode disposed on an insulation film over a surface of said first base region sandwiched between said first source region and an exposed area of said base layer;

a second gate electrode disposed on an insulation film over an exposed area of said first base region sandwiched between said second source region and said emitter region;

a first main electrode contacting said emitter layer; and a second main electrode contacting in common said emitter region, said first source region, and said first base region in a void of said first source region; and an auxiliary electrode contacting in common said second source region and said first base region.

2. The insulated gate thyristor as claimed in claim 1, further comprising a second base region of the second conductivity type and of a low resistivity selectively formed in a region of said first base region including a region underneath a part of said first source region and said second source region.

3. The insulated gate thyristor as claimed in claim 2, further comprising a contact region of the second conductivity type and of a further lower resistivity selectively formed in a region of a surface layer of said second base region adjacent to said second source region, said contact region contacting said auxiliary electrode.

4. The insulated gate thyristor as claimed in claim 1, wherein said first source region comprises a stripe, in a longitudinal direction thereof said void is arranged.

5. The insulated gate thyristor as claimed in claim 2, wherein said first source region comprises a stripe, in a longitudinal direction thereof said void is arranged.

6. The insulated gate thyristor as claimed in claim 3, wherein said first source region comprises a stripe, in a longitudinal direction thereof said void is arranged.

* * * * *